US012581978B2

(12) United States Patent
Hwang et al.

(10) Patent No.: US 12,581,978 B2
(45) Date of Patent: Mar. 17, 2026

(54) SEMICONDUCTOR PACKAGE INCLUDING UNDER BUMP METALLIZATION PAD

(71) Applicant: Samsung Electronics Co., Ltd., Suwon-si (KR)

(72) Inventors: Hyeonjeong Hwang, Suwon-si (KR); Kyounglim Suk, Suwon-si (KR); Seokhyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/748,765

(22) Filed: Jun. 20, 2024

(65) Prior Publication Data

US 2024/0347435 A1 Oct. 17, 2024

Related U.S. Application Data

(63) Continuation of application No. 17/508,250, filed on Oct. 22, 2021, now Pat. No. 12,040,264.

(30) Foreign Application Priority Data

Apr. 12, 2021 (KR) ........................ 10-2021-0047153

(51) Int. Cl.
H01L 23/498 (2006.01)
H01L 23/00 (2006.01)
(Continued)

(52) U.S. Cl.
CPC .................. H01L 23/49822 (2013.01); H01L 23/49816 (2013.01); H01L 23/49833 (2013.01);
(Continued)

(58) Field of Classification Search
CPC ......... H01L 23/49822; H01L 23/49816; H01L 23/49833; H01L 23/49838; H01L 24/16;
(Continued)

(56) References Cited

U.S. PATENT DOCUMENTS 9,136,211 B2 9/2015 Wang et al.
9,196,586 B2 11/2015 Chen et al.
(Continued)

FOREIGN PATENT DOCUMENTS

JP 2015144157 A 8/2015
KR 1020150007986 A 1/2015
KR 1020210023021 A 3/2021

*Primary Examiner* — Jasmine J Clark
(74) *Attorney, Agent, or Firm* — Muir Patent Law, PLLC

(57) ABSTRACT

A semiconductor package includes a semiconductor chip, a lower redistribution layer disposed under the semiconductor chip, the lower redistribution layer including a plurality of lower insulating layers, a plurality of lower redistribution patterns, and a plurality of lower conductive vias, a lower passivation layer disposed under the lower redistribution layer and provided with a recess at a bottom surface of the lower passivation layer, an under bump metallization (UBM) pad disposed in the first recess, a UBM protective layer disposed in the first recess and connected to the lower conductive vias while covering a top surface and opposite side surfaces of the UBM pad, and an outer connecting terminal connected to a bottom surface of the UBM pad. The bottom surface of the UBM pad is positioned at a first depth from the bottom surface of the lower passivation layer.

20 Claims, 10 Drawing Sheets

20

(51) Int. Cl.
*H01L 25/065* (2023.01)
*H01L 25/10* (2006.01)

(52) U.S. Cl.
CPC ........ *H01L 23/49838* (2013.01); *H01L 24/16* (2013.01); *H01L 24/32* (2013.01); *H01L 24/73* (2013.01); *H01L 24/81* (2013.01); *H01L 24/83* (2013.01); *H01L 24/48* (2013.01); *H01L 25/0657* (2013.01); *H01L 25/105* (2013.01); *H01L 2224/16235* (2013.01); *H01L 2224/32225* (2013.01); *H01L 2224/48227* (2013.01); *H01L 2224/73204* (2013.01)

(58) Field of Classification Search
CPC ......... H01L 24/32; H01L 24/72; H01L 24/81; H01L 24/83
USPC ........................................................ 257/737
See application file for complete search history.

(56) References Cited

U.S. PATENT DOCUMENTS

| | | | |
|---|---|---|---|
| 9,257,333 B2 | 2/2016 | Lu et al. | |
| 9,548,240 B2 | 1/2017 | Lin et al. | |
| 10,276,402 B2 | 4/2019 | Chen et al. | |
| 10,283,473 B1 | 5/2019 | Yu et al. | |
| 10,446,478 B2 * | 10/2019 | Jeong | H01L 23/49822 |
| 10,861,814 B2 | 12/2020 | Lee et al. | |
| 10,879,220 B2 | 12/2020 | Yu et al. | |
| 11,990,439 B2 * | 5/2024 | Lee | H01L 23/49816 |
| 2015/0014020 A1 | 1/2015 | Kaneko et al. | |
| 2019/0333849 A1 | 10/2019 | Furuichi | |
| 2020/0144076 A1 | 5/2020 | Kang et al. | |
| 2021/0057344 A1 | 2/2021 | Kim | |

* cited by examiner

FIG. 1

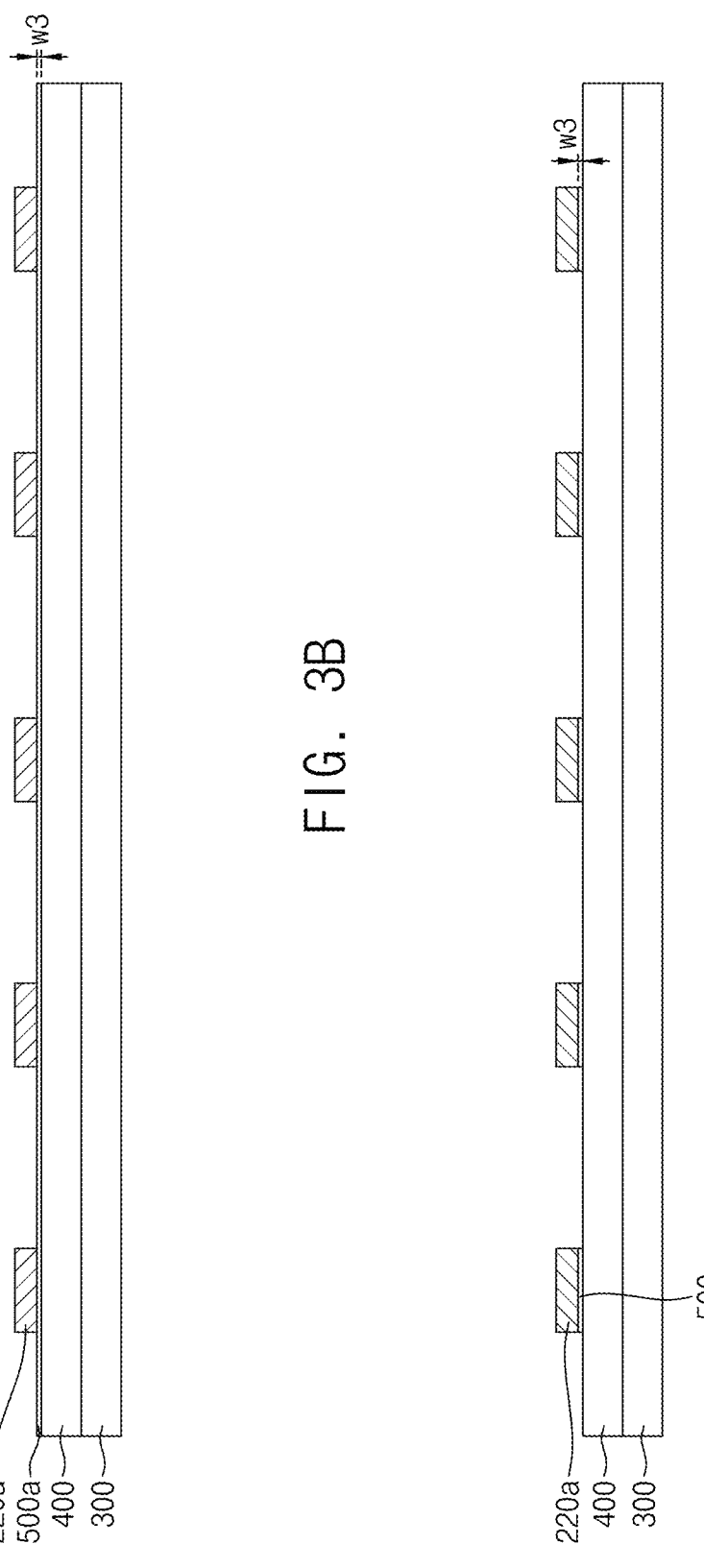

FIG. 4

SEMICONDUCTOR PACKAGE INCLUDING UNDER BUMP METALLIZATION PAD

CROSS-REFERENCE TO THE RELATED APPLICATION

This application is a continuation of U.S. patent application Ser. No. 17/508,250, filed on Oct. 22, 2021, now U.S. Pat. No. 12,040,264, which claims priority from Korean Patent Application No. 10-2021-0047153, filed on Apr. 12, 2021, in the Korean Intellectual Property Office, the disclosure of each of which is incorporated herein by reference in its entirety.

BACKGROUND

1. Field

The exemplary embodiments of the disclosure relate to a semiconductor package including an under bump metallization (UBM) pad.

2. Description of the Related Art

Generally, a packaging process is performed for semiconductor chips formed through various semiconductor processes conducted for a wafer, thereby forming a semiconductor package. Such a semiconductor package may include a semiconductor chip, a redistribution layer, an under bump metallization (UBM) pad disposed under the redistribution layer, and a solder ball connected to the UBM pad. Enhancements in reliability and processability of the semiconductor package, as well as high integration of the semiconductor package, are desirable.

SUMMARY

The exemplary embodiments of the disclosure provide a semiconductor package having an enhancement in reliability.

A semiconductor package according to an exemplary embodiment of the disclosure includes a semiconductor chip, a lower redistribution layer disposed under the semiconductor chip, the lower redistribution layer including a plurality of lower insulating layers, a plurality of lower redistribution patterns, and a plurality of lower conductive vias, a lower passivation layer disposed under the lower redistribution layer and provided with a first recess at a bottom surface of the lower passivation layer, an under bump metallization (UBM) pad disposed in the first recess of the lower passivation layer, a UBM protective layer disposed in the first recess of the lower passivation layer and covering a top surface and opposite side surfaces of the UBM pad, and an outer connecting terminal connected to a bottom surface of the UBM pad. The bottom surface of the UBM pad is positioned at a first depth from the bottom surface of the lower passivation layer.

A method for manufacturing a semiconductor package in accordance with an exemplary embodiment of the disclosure includes depositing an under bump metallization (UBM) seed layer on a photoimageable dielectric (PID) release layer, forming a UBM pad on the UBM seed layer, etching a portion of the UBM seed layer, thereby forming a UBM seed pattern and exposing a portion of the PID release layer, depositing a UBM protective layer covering the PID release layer and the UBM pad, forming a lower passivation layer covering the UBM protective layer, forming a lower redistribution layer on the lower passivation layer, mounting a semiconductor chip on the lower redistribution layer, forming, on the lower redistribution layer, a molding layer surrounding the semiconductor chip, removing the PID release layer, removing the UBM seed pattern and a portion of the UBM protective layer, thereby exposing a bottom surface of the UBM pad, and removing a portion of the UBM pad such that the bottom surface of the UBM pad has a first depth from a bottom surface of the lower passivation layer.

A semiconductor package according to an exemplary embodiment of the disclosure includes a semiconductor chip, a lower redistribution layer disposed under the semiconductor chip, the lower redistribution layer including a plurality of lower insulating layers, a plurality of lower redistribution patterns disposed at the plurality of lower insulating layers, respectively, and a plurality of lower conductive vias interconnecting the plurality of lower redistribution patterns with each other, a lower barrier layer covering side surfaces of the plurality of lower redistribution patterns and side surfaces and bottom surfaces of the plurality of lower conductive vias, an underfill disposed between the semiconductor chip and the lower redistribution layer, a lower passivation layer disposed under the lower redistribution layer and provided with a first recess at a bottom surface of the lower passivation layer, an under bump metallization (UBM) pad disposed at the first recess of the lower passivation layer, a UBM protective layer disposed in the first recess of the lower passivation layer and connected to the lower barrier layer, the UBM protective layer covering a top surface and opposite side surfaces of the UBM pad, a molding layer disposed on the lower redistribution layer and covering the semiconductor chip, an upper redistribution layer disposed on the molding layer, the upper redistribution layer including a plurality of upper insulating layers, a plurality of upper redistribution patterns disposed at the plurality of upper insulating layers, respectively, and a plurality of upper conductive vias interconnecting the plurality of upper redistribution patterns, an upper barrier layer covering side surfaces of the plurality of upper redistribution patterns and side surfaces and bottom surfaces of the plurality of upper conductive vias, and a connecting via interconnecting the lower redistribution layer and the upper redistribution layer with each other. A bottom surface of the UBM pad is positioned at a first depth from the bottom surface of the lower passivation layer. The bottom surface of the lower passivation layer is coplanar with a bottom surface of the UBM protective layer.

BRIEF DESCRIPTION OF THE DRAWINGS

FIG. 1 is a sectional view of a semiconductor package according to an exemplary embodiment of the disclosure.

FIGS. 3A to 3G are sectional views of a semiconductor package manufacturing method according to an exemplary embodiment of the disclosure.

FIG. 4 is a sectional view of a semiconductor package according to an exemplary embodiment of the disclosure.

DETAILED DESCRIPTION OF EXEMPLARY EMBODIMENTS

Figure 1:
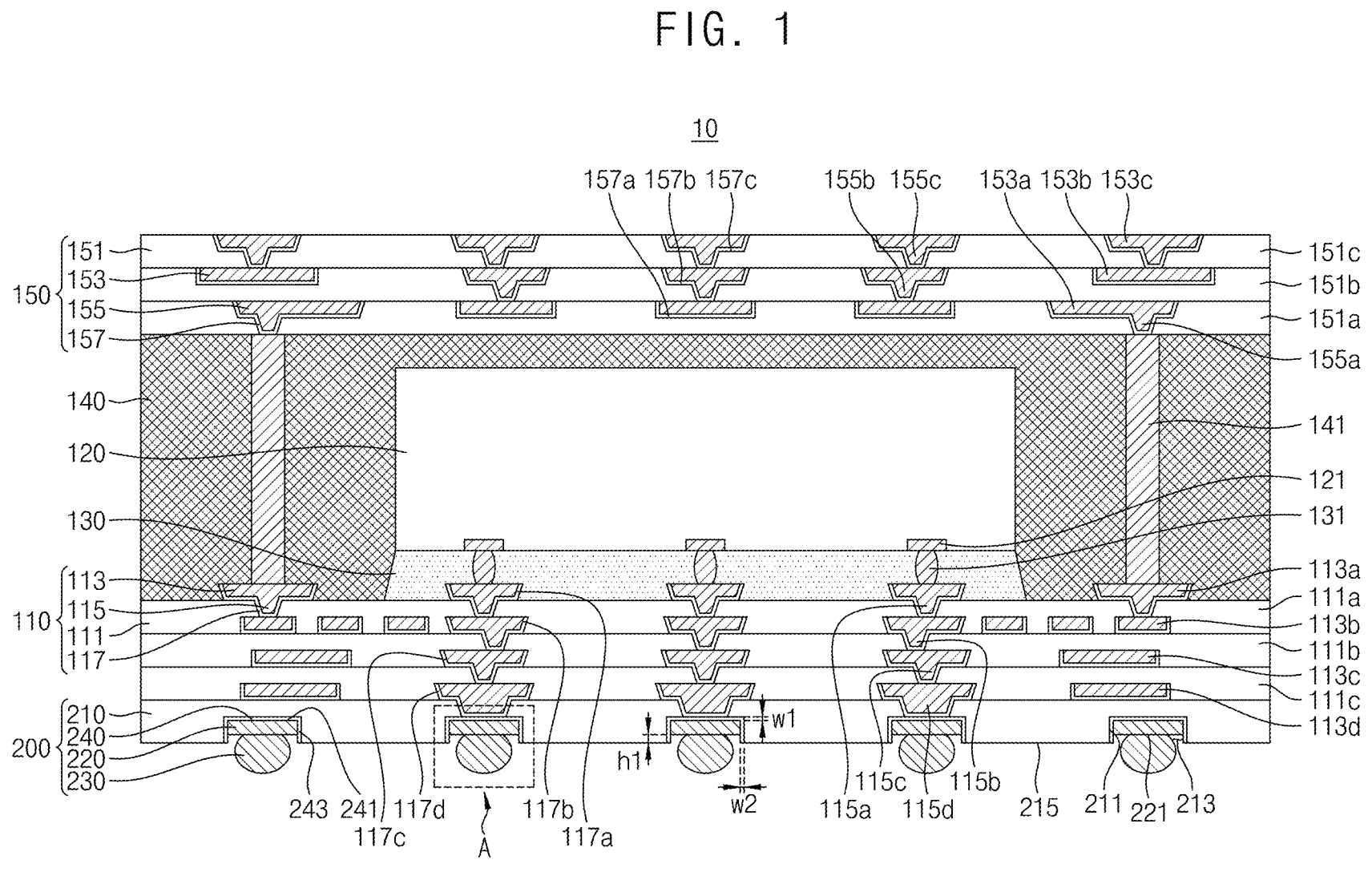
Figure 2:
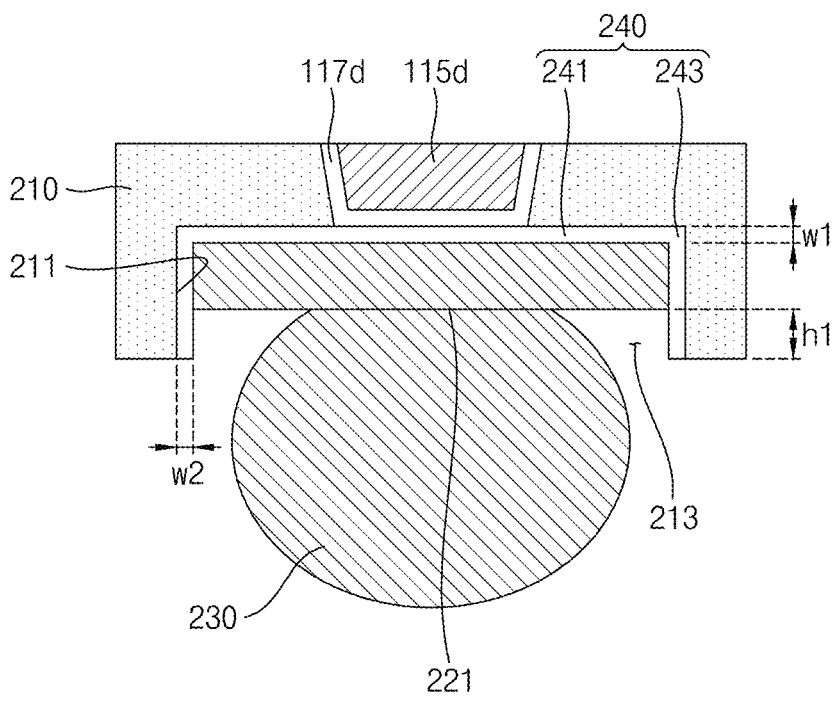
FIG. 2 is an enlarged view of a portion A of FIG. 1.

FIG. 1 is a sectional view of a semiconductor package according to an exemplary embodiment of the disclosure. FIG. 2 is an enlarged view of a portion A of FIG. 1.

Referring to FIGS. 1 and 2, a semiconductor package 10 may include a lower redistribution layer 110, an under bump metallization (UBM) structure 200, a semiconductor chip 120, an underfill 130, a molding layer 140, and an upper redistribution layer 150.

The lower redistribution layer 110 may be disposed under the semiconductor package 10. The lower redistribution layer 110 may include a plurality of lower insulating layers 111, a plurality of lower redistribution patterns 113, a plurality of lower conductive vias 115, and a plurality of lower barrier layers 117. The lower insulating layers 111 may include a first lower insulating layer 111a, a second lower insulating layer 111b contacting a bottom surface of the first lower insulating layer 111a at a top surface thereof, and a third lower insulating layer 111c contacting a bottom surface of the second lower insulating layer 111b at a top surface thereof. For example, the lower insulating layer 111 may include or may be formed of an Ajinomoto build-up film (ABF), epoxy, polyimide, or a photosensitive polymer. The photosensitive polymer may include or may be formed of at least one of photosensitive polyimide, polybenzeoxazole, a phenol series polymer and a benzocyclobutene series polymer. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower redistribution patterns 113 may include a first lower redistribution pattern 113a disposed on the first lower insulating layer 111a, a second lower redistribution pattern 113b disposed in the first lower insulating layer 111a, a third lower redistribution pattern 113c disposed in the second lower insulating layer 111b, and a fourth lower redistribution pattern 113d disposed in the third lower insulating layer 111c. For example, the lower redistribution patterns 113 may include or may be formed of copper, nickel, stainless steel or a copper alloy such as beryllium copper.

The lower conductive vias 115 may include a first lower conductive via 115a electrically interconnecting the first lower redistribution pattern 113a and the second lower redistribution pattern 113b with each other while extending through the first lower insulating layer 111a, a second lower conductive via 115b electrically interconnecting the second lower redistribution pattern 113b and the third lower redistribution pattern 113c with each other while extending through the second lower insulating layer 111b, a third lower conductive via 115c electrically interconnecting the third lower redistribution pattern 113c and the fourth lower redistribution pattern 113d with each other while extending through the third lower insulating layer 111c, and a fourth lower conductive via 115d electrically interconnecting the fourth lower redistribution pattern 113d and the UBM structure 200 with each other. For example, the lower conductive vias 115 may include or may be formed of copper, nickel, stainless steel or a copper alloy such as beryllium copper. The lower barrier layers 117 may include a first lower barrier layer 117a covering opposite side surfaces and a portion of a bottom surface of the first lower redistribution pattern 113a and opposite side surfaces and a bottom surface of the first lower conductive via 115a, a second lower barrier layer 117b covering opposite side surfaces and a portion of a bottom surface of the second lower redistribution pattern 113b and opposite side surfaces and a bottom surface of the second lower conductive via 115b, a third lower barrier layer 117c covering opposite side surfaces and a portion of a bottom surface of the third lower redistribution pattern 113c and opposite side surfaces and a bottom surface of the third lower conductive via 115c, and a fourth lower barrier layer 117d covering opposite side surfaces and a portion of a bottom surface of the fourth lower redistribution pattern 113d and opposite side surfaces and a bottom surface of the fourth lower conductive via 115d. The lower barrier layer 117 may include or may be formed of Ti. For example, the lower barrier layer 117 may include or may be formed of at least one of Ti, $TiO_2$, CrN, TiCN, and TiAlN.

The UBM structure 200 may be disposed under the lower redistribution layer 110. The UBM structure 200 may include a lower passivation layer 210, a UBM pad 220, an outer connecting terminal 230, and a UBM protective layer 240.

A top surface of the lower passivation layer 210 may contact a bottom surface of the third lower insulating layer 111c. A first recess 211 may be formed at a bottom portion of the lower passivation layer 210 such that the first recess 211 extends upwards from a bottom surface of the lower passivation layer 210. The first recess 211 may have a downwardly-opened shape. The first recess 211 may expose a portion of the lower redistribution layer 110. For example, the first recess 211 may expose a lower surface of the fourth lower barrier layer 117d of the lower redistribution layer 110. Widths of top and bottom portions of the first recess 211 may be equal to each other. For example, the lower passivation layer 210 may include or may be formed of a photoimageable dielectric (PID).

The UBM pad 220 may be disposed at the bottom portion of the lower passivation layer 210. The UBM pad 220 may be disposed in the first recess 211 of the lower passivation layer 210. The UBM pad 220 may be spaced apart from the lower passivation layer 210 without contacting the lower passivation layer 210. The UBM pad 220 may be spaced apart from the fourth lower barrier layer 117d without contacting the fourth lower barrier layer 117d.

A bottom surface 221 of the UBM pad 220 may have a first depth hi from a bottom surface 215 of the lower passivation layer 210. In an embodiment, the first depth hi may be between 400 nm and 600 nm. The outer connecting terminal 230 may be disposed at a portion of the bottom surface 221 of the UBM pad 220, and a remaining portion of the bottom surface 221 of the UBM pad 220 may be exposed. The outer connecting terminal 230 may be a solder ball or a solder bump. For example, the UBM pad 220 may include or may be formed of copper.

The UBM protective layer 240 may be disposed under the lower passivation layer 210. The UBM protective layer 240 may be disposed in the first recess 211 of the lower passivation layer 210. The UBM protective layer 240 may cover an inner side surface and an inner bottom surface of the lower passivation layer 210 defining the first recess 211. The UBM protective layer 240 may contact the fourth lower barrier layer 117d. The UBM protective layer 240 may include a horizontal section 241 covering a top surface of the UBM pad 220, and a vertical section 243 covering a side surface of the UBM pad 220 at a portion thereof while being exposed at a remaining portion thereof. A portion of the horizontal section 241 may be disposed between the lower passivation layer 210 and the UBM pad 220, and a remaining portion of the horizontal section 241 may be disposed between the UBM pad 220 and the fourth lower barrier layer 117d. For example, a thickness w1 of the horizontal section 241 may be 3 nm or less. A portion of the vertical section 243 may be disposed between the lower passivation layer
210 and the UBM pad 220, and a remaining portion of the
vertical section 243 may be exposed. In an embodiment, a
bottom surface of the vertical section 243 may be coplanar
with the bottom surface 215 of the lower passivation layer
210. For example, a thickness w2 of the vertical section 243
may be equal to the thickness w1 of the horizontal section
241. The UBM protective layer 240 may be electrically
connected to the lower redistribution layer 110 by the fourth
lower conductive via 115d. For example, the UBM protec-
tive layer 240 may include or may be formed of Ti. A second
recess 213 may be defined by the bottom surface 221 of the
UBM pad 220 and the vertical section 243 of the UBM
protective layer 240. At least a portion of the outer connect-
ing terminal 230 may be disposed in the second recess 213.

The semiconductor chip 120 may be disposed over the
lower redistribution layer 110. The semiconductor chip 120
may be disposed at a central portion of the lower redistri-
bution layer 110. Although only one semiconductor chip 120
is shown in the drawing, this is only illustrative, and the
semiconductor chip 120 may be disposed in plural. For
example, the semiconductor chip 120 may be an application
processor (AP) chip such as a microprocessor and a micro-
controller, a logic chip such as a central processing unit
(CPU), a graphics processing unit (GPU), a modem, an
application-specific integrated circuit (ASIC), and a field
programmable gate array (FPGA), a volatile memory such
as dynamic random access memory (DRAM), and static
random access memory (SRAM), a non-volatile memory
such as phase-change random access memory (PRAM),
magnetoresistive random access memory (MRAM), ferro-
electric random access memory (FeRAM), and resistive
random access memory (RRAM), flash memory or high-
bandwidth memory (HBM), or may be configured by a
combination thereof. The semiconductor chip 120 may
include a conductive pad 121. The conductive pad 121 may
be disposed on a bottom surface of the semiconductor chip
120. For example, the conductive pad 121 may include or
may be formed of at least one of electrolytically-deposited
(ED) copper foil, rolled-annealed (RA) copper foil, stainless
steel foil, aluminum foil, ultra-thin copper foil, sputtered
copper, and copper alloys.

The underfill 130 may be interposed between the lower
redistribution layer 110 and the semiconductor chip 120. The
underfill 130 may fill a space between the lower redistribu-
tion layer 110 and the semiconductor chip 120. The underfill
130 may include an underfill resin such as epoxy resin. The
underfill 130 may include a silica filler, or a flux. For
example, the silica filler or the flux may be included or
distributed in the underfill resin. An inner connecting ter-
minal 131 may be disposed between the redistribution layer
110 and the semiconductor chip 120. The inner connecting
terminal 131 may electrically interconnect the first lower
redistribution pattern 113a and the conductive pad 121 with
each other. For example, the inner connecting terminal 131
may be constituted by the same material as the conductive
pad 121. For example, the inner connecting terminal 131
may be a solder ball.

The molding layer 140 may be disposed on the lower
redistribution layer 110. A bottom surface of the molding
layer 140 may contact a top surface of the lower redistri-
bution layer 110. The molding layer 140 may cover the
semiconductor chip 120 and the underfill 130. The molding
layer 140 may include or may be formed of an epoxy
molding compound (EMC), a thermoplastic resin such as
polyimide, or a resin formed by including a reinforcement
such as an inorganic filler in the EMC or the thermoplastic resin, for example, an Ajinomoto build-up film (ABF), FR-4,
a bismaleimide triazine (BT) resin, etc., or may use a
molding material such as an EMC or a photosensitive
material such as a photoimageable encapsulant (PIE). A
connecting via 141 may be provided in the molding layer
140. The connecting via 141 may be disposed at opposite
sides of the molding layer 140. The connecting via 141 may
extend through the molding layer 140 in a vertical direction.
The connecting via 141 may be electrically connected to the
first lower redistribution pattern 113a. For example, the
connecting via 141 may include or may be formed of the
same material as the lower conductive via 115.

The upper redistribution layer 150 may include an upper
insulating layer 151, an upper redistribution pattern 153, an
upper conductive via 155, and an upper barrier layer 157.
The upper insulating layer 151 may include a first upper
insulating layer 151a disposed on the molding layer 140, a
second upper insulating layer 151b disposed on the first
upper insulating layer 151a, and a third upper insulating
layer 151c disposed on the second upper insulating layer
151b. The upper insulating layer 151 may include or may be
formed of the same material as the lower insulating layer
111.

The upper redistribution pattern 153 may include a first
upper redistribution pattern 153a disposed in the first upper
insulating layer 151a, a second upper redistribution pattern
153b disposed in the second upper insulating layer 151b, and
a third upper redistribution pattern 153c disposed in the third
upper insulating layer 151c. The upper redistribution pattern
153 may include or may be formed of the same material as
the lower redistribution pattern 113.

The upper conductive via 155 may include a first upper
conductive via 155a electrically interconnecting the con-
necting via 141 and the first upper redistribution pattern
153a with each other while extending through the first upper
insulating layer 151a, a second upper conductive via 155b
electrically interconnecting the first upper redistribution
pattern 153a and the second upper redistribution pattern
153b with each other while extending through the second
upper insulating layer 151b, a third upper conductive via
155c electrically interconnecting the second upper redistri-
bution pattern 153b and the third upper redistribution pattern
153c with each other while extending through the third
upper insulating layer 151c. The upper conductive via 155
may be constituted by the same material as the lower
conductive via 115. The upper barrier layer 157 may include
a first upper barrier layer 157a covering opposite side
surfaces and a portion of a bottom surface of the first upper
redistribution pattern 153a and opposite side surfaces and a
bottom surface of the first upper conductive via 155a, a
second upper barrier layer 157b covering opposite side
surfaces and a portion of a bottom surface of the second
upper redistribution pattern 153b and opposite side surfaces
and a bottom surface of the second upper conductive via
155b, and a third upper barrier layer 157c covering opposite
side surfaces and a portion of a bottom surface of the third
upper redistribution pattern 153c and opposite side surfaces
and a bottom surface of the third upper conductive via 155c.

FIGS. 3A to 3G are sectional views of a semiconductor
package manufacturing method according to an exemplary
embodiment of the disclosure.

Referring to FIG. 3A, a PID release layer 400 may be
formed on a carrier 300, a UBM seed layer 500a may be
deposited on the PID release layer 400, and a UBM pad 220a
may be formed on the UBM seed layer 500a. The UBM pad
220a may be formed through a plating process. For example, the plating process may be electroplating. For example, a thickness w3 of the UBM seed layer 500a may be 3 nm or less.

Referring to FIG. 3B, a portion of the UBM seed layer 500a may be etched, thereby exposing a portion of the PID release layer 400. A portion of the UBM seed layer 500a not covered by the UBM pad 220a, may be removed through an etching process and, as such, a UBM seed pattern 500 may be formed. Opposite side surfaces of the UBM seed pattern 500 may be aligned with opposite side surfaces of the UBM pad 220a. A top surface of the UBM seed pattern 500 may be completely covered by the UBM pad 220a. In an embodiment, the etching process may be an isotropic etching process or an anisotropic etching process. Meanwhile, although not shown, an undercut may be created at opposite side surfaces of the UBM seed layer 500a when an isotropic etching process is performed.

Figure 3C:
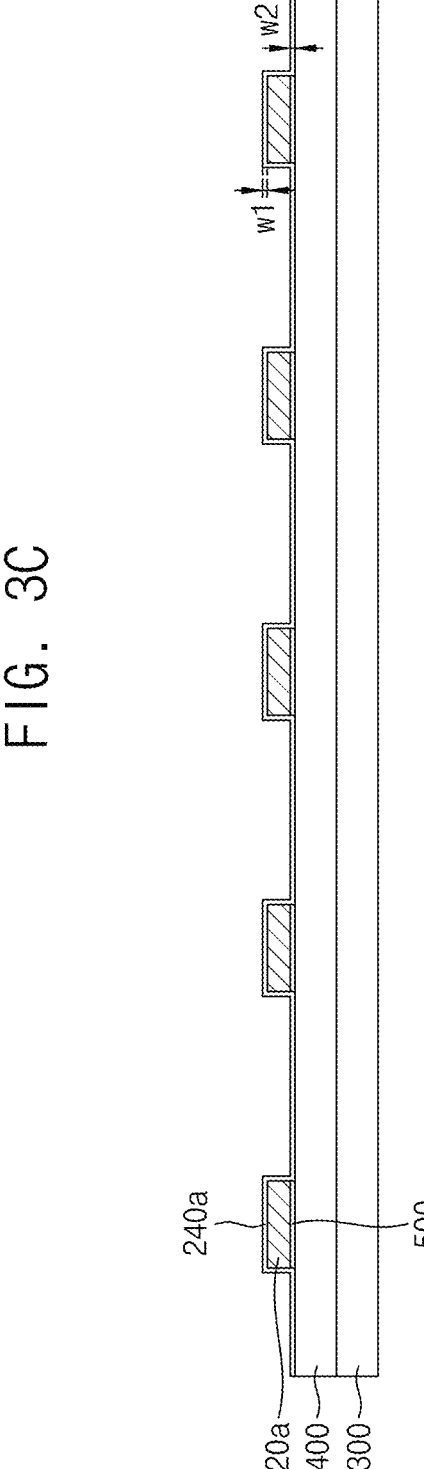

Referring to FIG. 3C, a UBM protective layer 240a may be deposited. The UBM protective layer 240a may cover a top surface and a side surface of the UBM pad 220a, a side surface of the UBM seed pattern 500, and an exposed top surface of the PID release layer 400. For example, thicknesses w1 and w2 of the UBM protective layer 240a may be 3 nm or less.

Figure 3D:
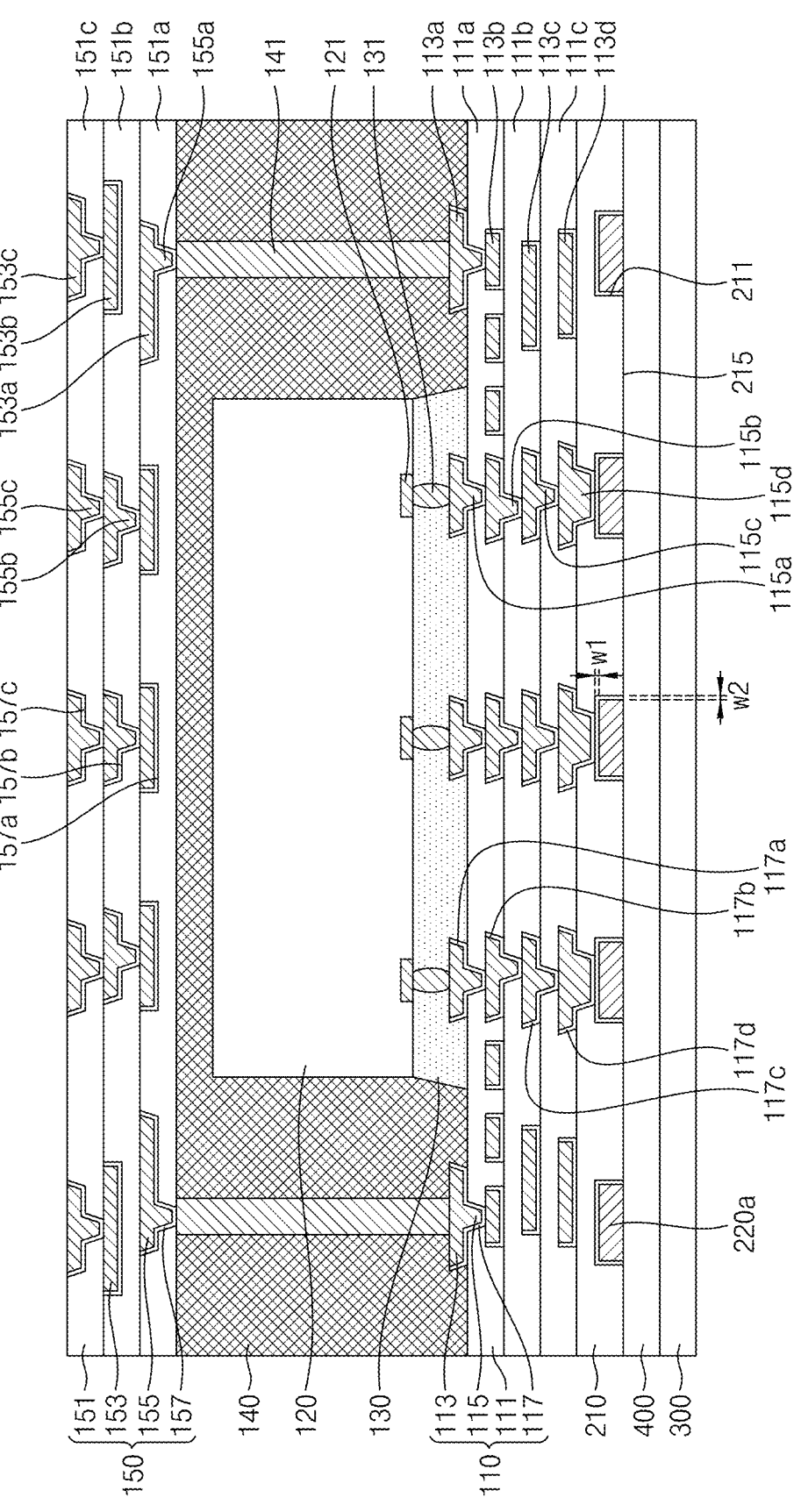

Referring to FIG. 3D, a lower passivation layer 210 may be formed to cover a top surface of the UBM protective layer 240a, a portion of a third lower insulating layer 111c may be formed on the lower passivation layer 210, an upwardly-opened trench may be formed at the lower passivation layer 210 and the third lower insulating layer 111c, and a seed layer and a barrier material may be formed on an inner side surface of the lower passivation layer 210 and an inner side surface of the third lower insulating layer 111c within the trench, thereby forming a fourth lower barrier layer 117d. Thereafter, a fourth lower redistribution pattern 113d and a fourth lower conductive via 115d may be formed in the trench formed as described above, and a remaining portion of the third lower insulating layer 111c may then be formed. Opposite side surfaces of the fourth lower redistribution pattern 113d and opposite side surfaces and a bottom surface of the fourth lower conductive via 115d may be covered by the fourth lower barrier layer 117d. The fourth lower redistribution pattern 113d and the fourth lower conductive via 115d may be formed through a plating process. Through repetition of the above-described procedure, a lower redistribution layer 110 may be formed. Furthermore, an inner connecting terminal 131 may be disposed on the lower redistribution layer 110, and a semiconductor chip 120 may be disposed on the inner connecting terminal 131. Subsequently, an underfill 130 may be formed under the semiconductor chip 120, and a connecting via 141 and a molding layer 140 may be formed on the lower redistribution layer 110. Thereafter, an upper redistribution layer 150 may be formed on the molding layer 140.

Figure 3E:
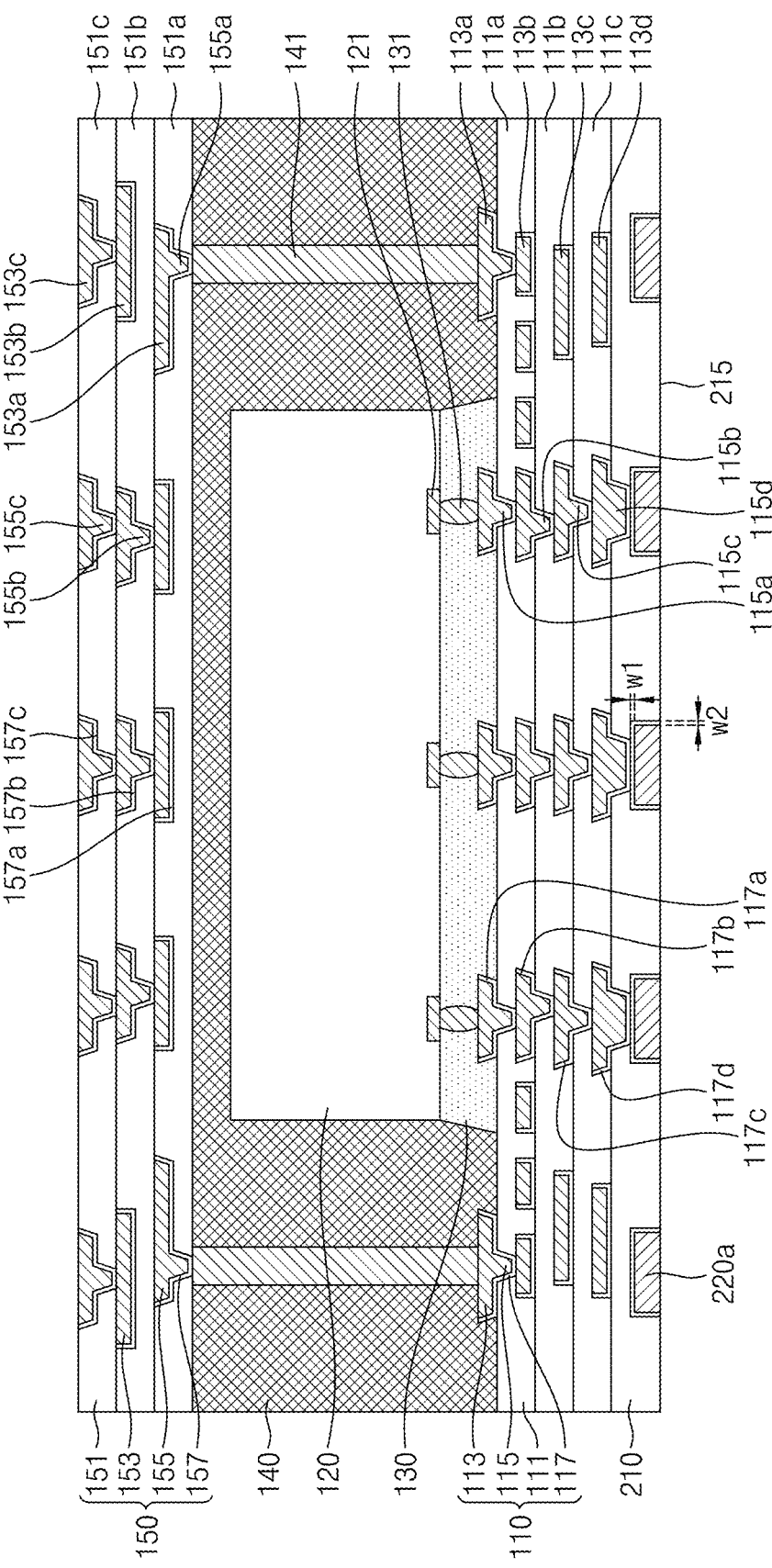

Referring to FIG. 3E, the carrier 300 and the PID release layer 400 may be removed, thereby exposing a portion of the UBM protective layer 240a and the UBM seed pattern 500. The portion of the UBM protective layer 240a may be a portion disposed on a bottom surface of the lower passivation layer 210. The portion of the UBM protective layer 240a and the UBM seed pattern 500 may be removed, thereby exposing the bottom surface of the lower passivation layer 210 and a bottom surface of the UBM pad 220a. The portion of the UBM protective layer 240a and the UBM seed pattern 500 may be removed through an etching process.

Figure 3F:
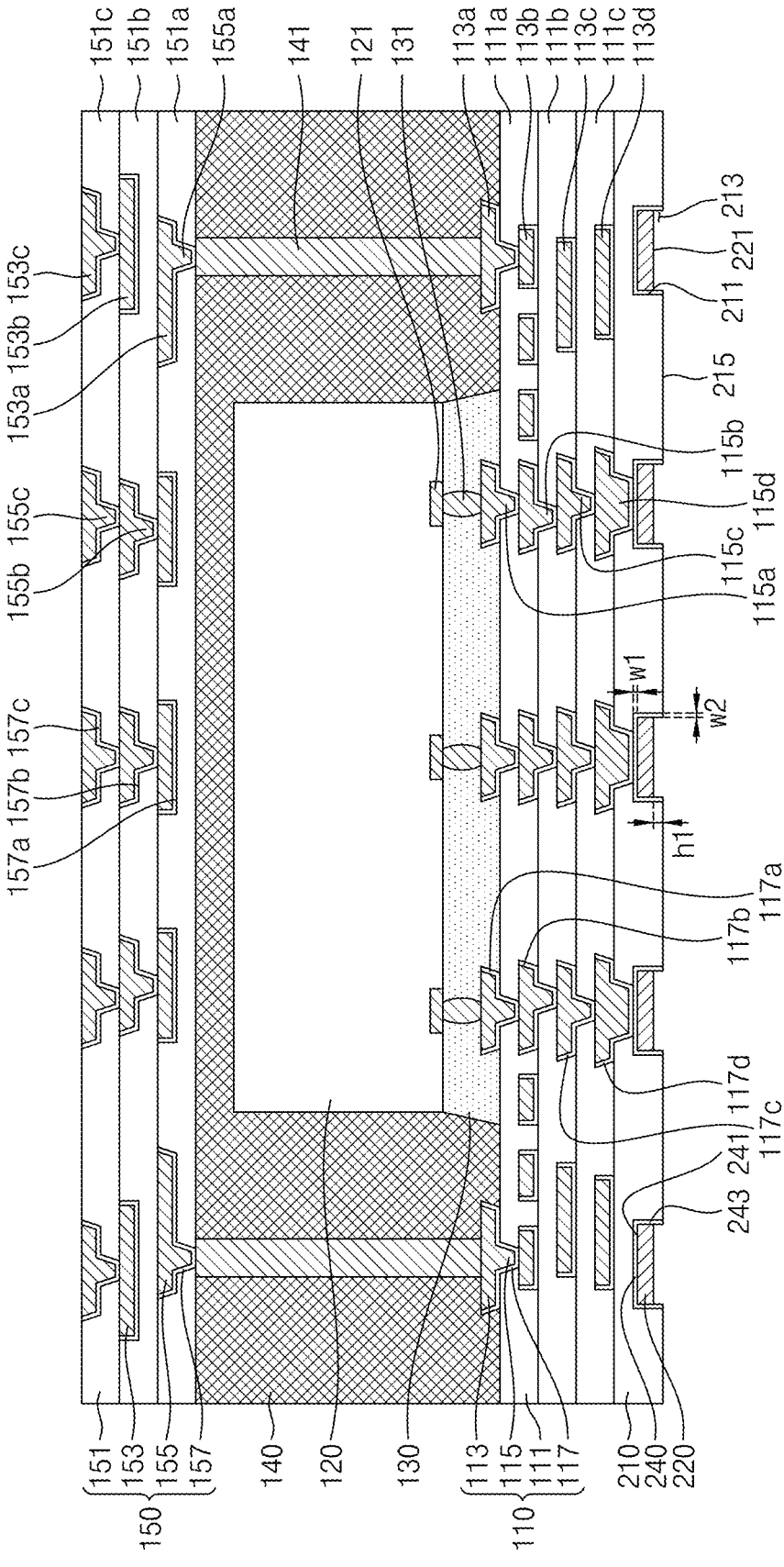

Referring to FIG. 3F, a portion of the UBM pad 220a may be removed. The portion of the UBM pad 220a may be removed such that the bottom surface of the UBM pad 220a has a depth hi with respect to a bottom surface 215 of the lower passivation layer 210. The first depth hi may be between 400 and 600 nm. The portion of the UBM pad 220a may be removed through an etching process. For example, the portion of the UBM pad 220a may be removed through an etch-back process. Meanwhile, as the portion of the UBM pad 220a is removed, it may be possible to prevent occurrence of a peeling-off phenomenon between the lower passivation layer 210 and the UBM pad 220a.

Figure 3G:
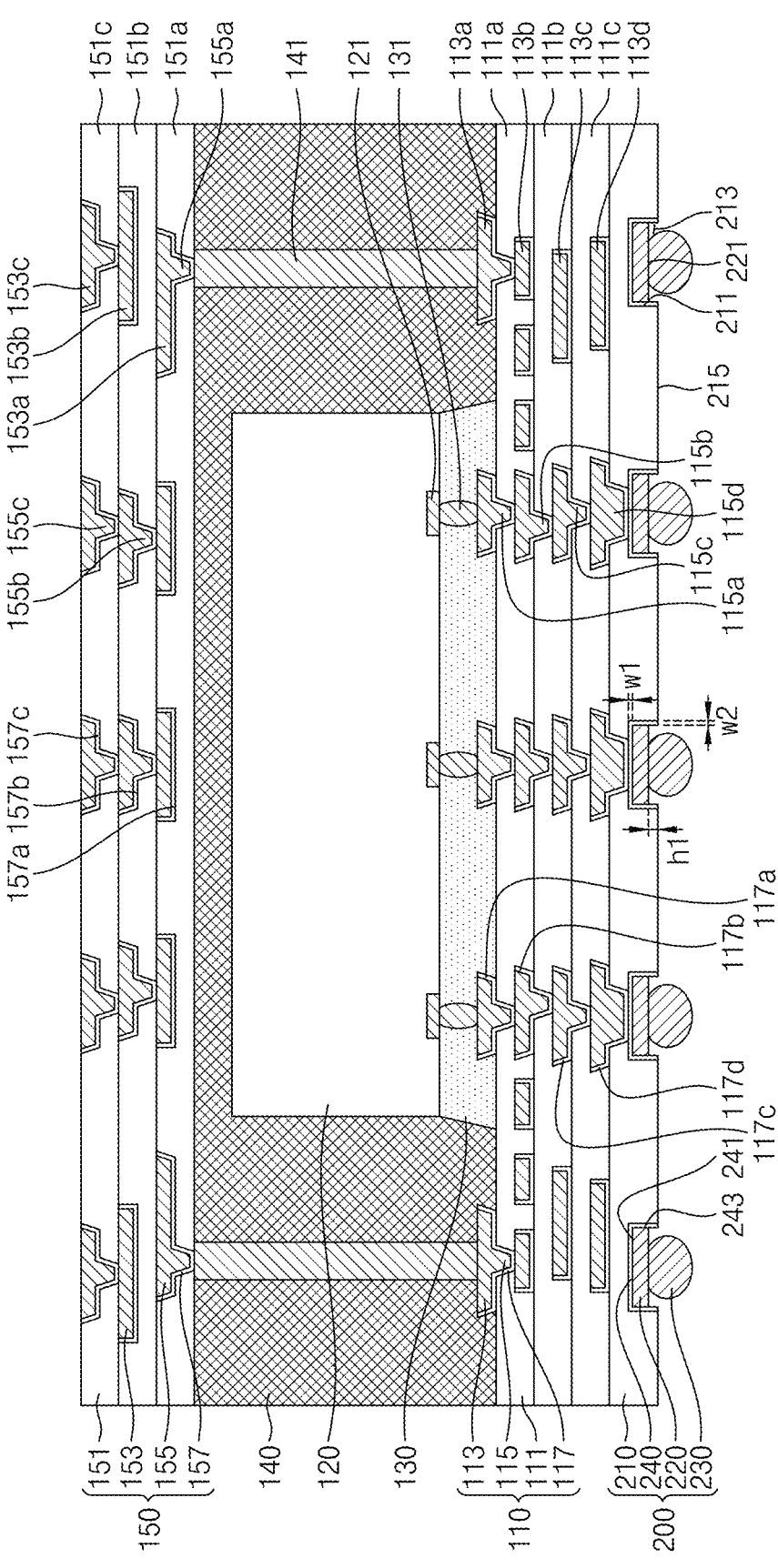

Referring to FIG. 3G, an outer connecting terminal 230 may be disposed at the bottom surface of the partially-removed UBM pad 220. In an embodiment, the outer connecting terminal 230 may expand and, as such, may contact an inner side surface of the UBM protective layer 240. When the UBM protective layer 240 is not provided, the outer connecting terminal 230 may contact the lower passivation layer 210. In this case, a peeling-off phenomenon may occur at the contact area. However, when the UBM protective layer 240 is provided in accordance with the exemplary embodiment of the disclosure, occurrence of such a peeling-off phenomenon may be prevented.

Figure 4:
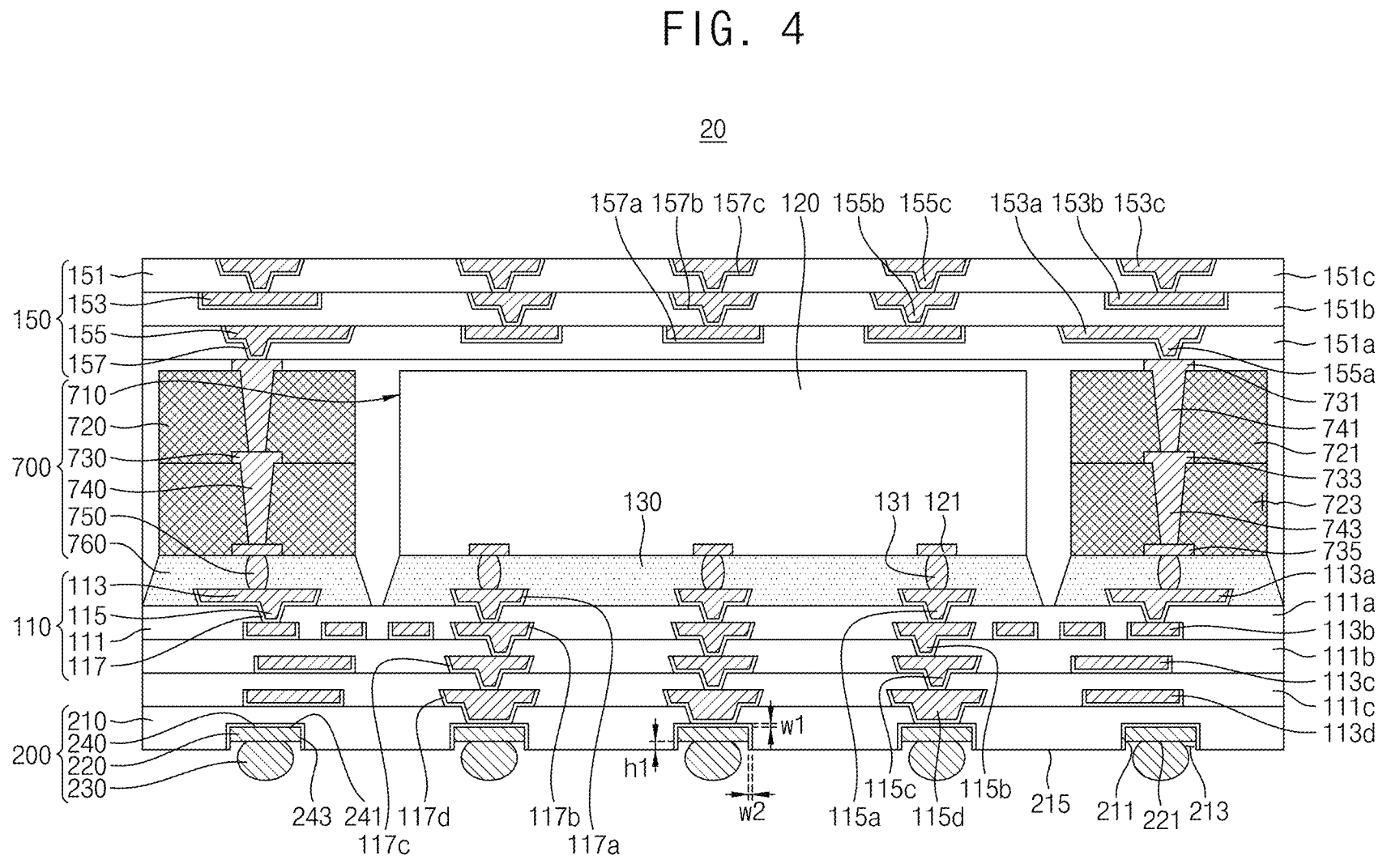

FIG. 4 is a sectional view of a semiconductor package according to an exemplary embodiment of the disclosure.

Referring to FIG. 4, a semiconductor package 20 may include a lower redistribution layer 110, a UBM structure 200, a semiconductor chip 120, a connecting layer 700, and an upper redistribution layer 150.

The connecting layer 700 may have a quadrangular rim shape when viewed in a plan view. The connecting layer 700 may include a cavity 710, a core 720, a connecting pad 730, a connecting via 740, an inner connecting terminal 750, and an underfill 760. The cavity 710 may be formed at a central portion of the connecting layer 700. The semiconductor chip 120 may be disposed in the cavity 710.

The core 720 may include a first core 721 disposed at an upper side, and a second core 723 disposed under the first core 721. For example, the core 720 may include or may be formed of an insulating material. The insulating material may include a thermosetting resin such as an epoxy resin, a thermoplastic resin such as polyimide, or a resin formed by impregnating the thermosetting resin or the thermoplastic resin into a core such as an inorganic filler, a glass fiber (glass fiber, glass cloth, or glass fabric), etc., for example, a prepreg, an Ajinomoto build-up film (ABF), FR-4, or bis-maleimide triazine (BT).

The connecting pad 730 may include a first connecting pad 731 disposed at a top surface of the first core 721, a second connecting pad 733 disposed on a bottom surface of the first core 721, and a third connecting pad 735 disposed on a bottom surface of the second core 723. The connecting pad 730 may include or may be formed of at least one of electrolytically-deposited (ED) copper foil, rolled-annealed (RA) copper foil, stainless steel foil, aluminum foil, ultra-thin copper foil, sputtered copper, and copper alloys.

The connecting via 740 may include a first via 741 electrically interconnecting the first connecting pad 731 and the second connecting pad 733 with each other while extending through the first core 721, and a second connecting via 743 electrically interconnecting the second connecting pad 733 and the third connecting pad 735 with each other while extending through the second core 723. For example, the connecting via 740 may include or may be formed of at least one of copper, nickel, stainless steel, and beryllium copper.

The inner connecting terminal 750 may be disposed under the third connecting pad 735 and, as such, may electrically interconnect the third connecting pad 735 and the first lower redistribution pattern 113*a* with each other. The underfill 760 may be interposed between the lower redistribution layer 110 and the second core 723. The underfill 760 may fill a space between the lower redistribution layer 110 and the second core 723.

Figure 5:
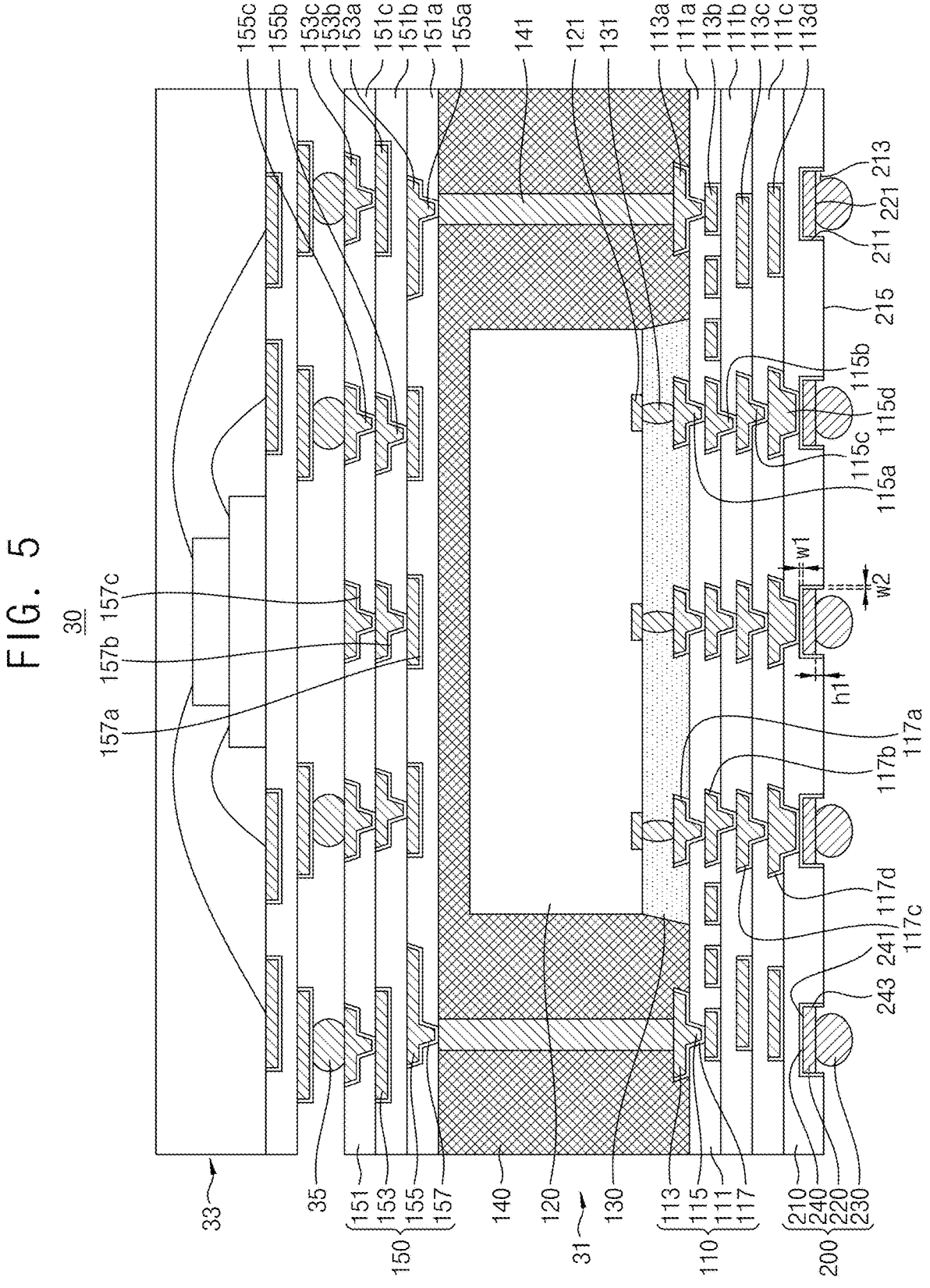
FIG. 5 is a sectional view of a semiconductor package according to an exemplary embodiment of the disclosure.

FIG. 5 is a sectional view of a semiconductor package according to an exemplary embodiment of the disclosure.

Referring to FIG. 5, a semiconductor package 30 may include a lower semiconductor package 31 and an upper semiconductor package 33. The lower semiconductor package 31 may be one of the semiconductor packages shown in FIGS. 1, 2 and 4. The upper semiconductor package 33 may be a memory or one of the semiconductor packages shown in FIGS. 1, 2 and 4. The upper semiconductor package 33 may be disposed on the lower semiconductor package 31. The lower semiconductor package 31 may be connected to the upper semiconductor package 33 by an outer connecting terminal 35 of the upper semiconductor package 33.

In accordance with the exemplary embodiments of the disclosure, reliability of a semiconductor package may be enhanced through provision of a UBM protective layer and removal of a portion of a UBM pad.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method for manufacturing a semiconductor package, comprising:
    depositing an under bump metallization (UBM) seed layer on a photoimageable dielectric (PID) release layer;
    forming a UBM pad on the UBM seed layer;
    etching a portion of the UBM seed layer, thereby forming a UBM seed pattern and exposing a portion of the PID release layer;
    depositing a UBM protective layer covering the PID release layer and the UBM pad;
    forming a lower passivation layer covering the UBM protective layer;
    forming a lower redistribution layer on the lower passivation layer;
    mounting a semiconductor chip on the lower redistribution layer;
    forming, on the lower redistribution layer, a molding layer surrounding the semiconductor chip;
    removing the PID release layer;
    removing the UBM seed pattern and a portion of the UBM protective layer, thereby exposing a bottom surface of the UBM pad; and
    removing a portion of the UBM pad such that the bottom surface of the UBM pad has a first depth from a bottom surface of the lower passivation layer.

2. The method according to claim 1,
    wherein the first depth is between 400 nm and 600 nm.

3. The method according to claim 1,
    wherein the forming of the lower redistribution layer comprises:
        forming a lower insulating layer on the lower passivation layer;
        forming a trench at the lower passivation layer and the lower insulating layer;
        forming a lower barrier layer in the trench; and forming a lower redistribution pattern and a lower conductive via in the trench.

4. The method according to claim 1,
    wherein the mounting of the semiconductor chip on the lower redistribution layer comprises:
        disposing an inner connecting terminal on the lower redistribution layer;
        mounting the semiconductor chip on the inner connecting terminal; and
        forming an underfill between the lower redistribution layer and the semiconductor chip.

5. The method according to claim 1, further comprising:
    forming an upper redistribution layer on the molding layer.

6. The method according to claim 1,
    wherein the forming of the molding layer comprises:
        disposing a connecting via on the lower redistribution layer; and
        forming the molding layer on the lower redistribution layer.

7. The method according to claim 1, further comprising:
    disposing an outer connecting terminal at the bottom surface of the UBM pad.

8. The method according to claim 1,
    wherein a cross-section of the UBM pad has a rectangular shape.

9. The method according to claim 1,
    wherein the UBM protective layer comprises Ti.

10. The method according to claim 1,
    wherein a thickness of the UBM protective layer is 3 nm or less.

11. A method for manufacturing a semiconductor package, comprising:
    forming an under bump metallization (UBM) pad;
    depositing a UBM protective layer covering a side surface and a top surface of the UBM pad;
    forming a lower passivation layer covering the UBM protective layer;
    forming a lower redistribution layer on the lower passivation layer;
    mounting a semiconductor chip on the lower redistribution layer;
    forming, on the lower redistribution layer, a molding layer surrounding the semiconductor chip;
    removing at least a portion of the UBM pad and forming a recess, such that at least a portion of an inner side surface of the UBM protective layer is exposed by the UBM pad; and
    forming an outer connecting terminal connected to a bottom surface of the UBM pad.

12. The method according to claim 11,
    wherein the bottom surface of the UBM protective layer and a bottom surface of the lower passivation layer are located on a same level.

13. The method according to claim 11,
    wherein the bottom surface of the UBM pad is located on a level higher than the level on which a bottom surface of the lower passivation layer is located.

14. The method according to claim 11,
    wherein at least a portion of the outer connecting terminal is located on a level higher than the level on which a lowermost end of the UBM protective layer is located.

15. The method according to claim 11,
    wherein the outer connecting terminal is connected to at least the portion of the inner side surface of the UBM protective layer.

16. The method according to claim 11,

Wherein the UBM protective layer comprises Ti.

17. A method for manufacturing a semiconductor package, comprising:

forming an under bump metallization (UBM) pad;

depositing a UBM protective layer covering a side surface and a top surface of the UBM pad;

forming a lower passivation layer covering the UBM protective layer;

forming a lower redistribution layer including on the lower passivation layer;

removing a portion of the UBM pad such that a bottom surface of the UBM pad has a first depth from a bottom surface of the lower passivation layer; and forming an outer connecting terminal connected to at least a portion of the bottom surface of the UBM pad, wherein forming the lower redistribution layer includes forming a lower barrier layer, a lower redistribution pattern and a lower conductive via, and wherein at least a portion of the lower barrier layer is in contact with at least a portion of an upper surface of the UBM pad.

18. The method according to claim 17, wherein the bottom surface of the lower passivation layer is coplanar with the bottom surface of the UBM protective layer.

19. The method according to claim 17, wherein the outer connecting terminal is not in contact with the lower passivation layer.

20. The method according to claim 19, wherein the outer connecting terminal is a solder ball or a solder bump.

\* \* \* \* \*